Figure 1:
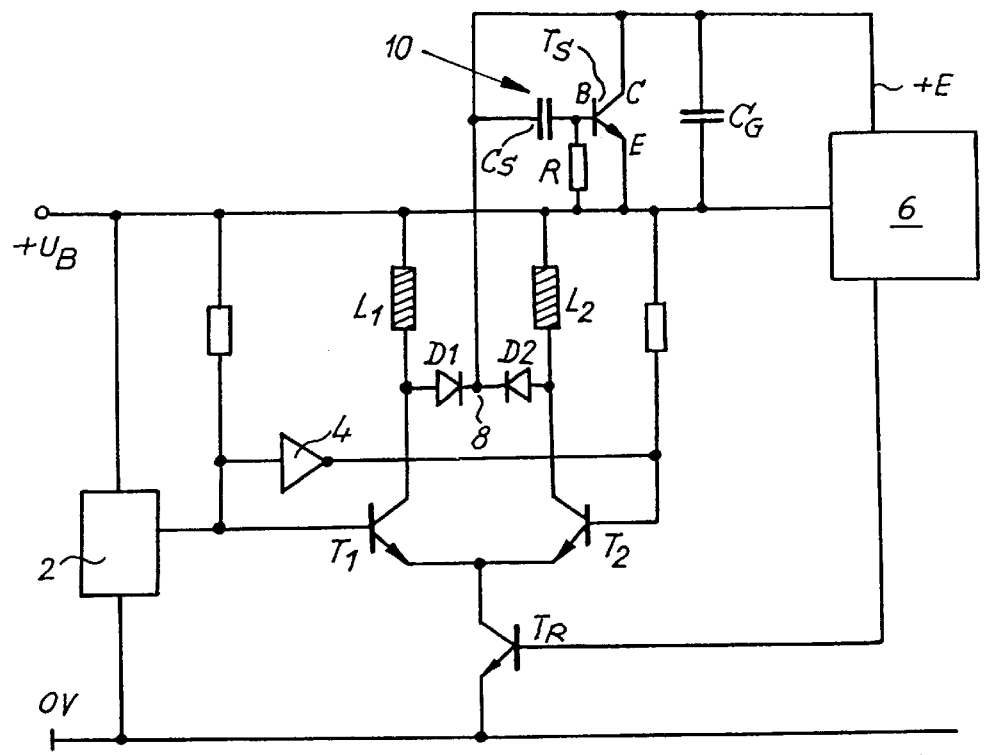

United States Patent [19]
Doemen

[11] Patent Number: 6,051,944
[45] Date of Patent: Apr. 18, 2000

[54] DRIVE-CIRCUIT OF A BRUSHLESS DC MOTOR

[75] Inventor: Benno Doemen, St. Georgen, Germany

[73] Assignee: Papst-Motoren GmbH & Co. KG, Germany

[21] Appl. No.: 08/953,255

[22] Filed: Oct. 17, 1997

[30]     Foreign Application Priority Data

Oct. 18, 1996 [DE]  Germany .................. 296 18 133 U

[51] Int. Cl.$^7$ .................................................. H02K 23/00
[52] U.S. Cl. ........................................... 318/254; 318/439
[58] Field of Search ..................................... 318/254, 439

[56]            References Cited

U.S. PATENT DOCUMENTS

| | | | |
|---|---|---|---|
| 4,594,535 | 6/1986 | Morikawa ........................... | 318/254 |
| 4,598,240 | 7/1986 | Cale et al. ............................ | 318/254 |

FOREIGN PATENT DOCUMENTS

| | | | |
|---|---|---|---|
| 0538 204 | 4/1993 | European Pat. Off. . | |
| 1806620 | 5/1970 | Germany . | |
| 2633047 | 1/1978 | Germany . | |
| 26 42 472 | 3/1978 | Germany . | |

*Primary Examiner*—Robert E. Nappi
*Assistant Examiner*—Rita Leykin
*Attorney, Agent, or Firm*—Jones & Askew

[57]            ABSTRACT

Drive circuit for a brushless, electronically commutated DC motor, wherein an electronic switching element ($T_1$, $T_2$) is arranged in series with each phase winding ($L_1$, $L_2$) of the motor and the switching elements ($T_1$, $T_2$) are driven in response to a sensor (2) for the rotational position of the rotor, in particular formed as a digital Hall IC, wherein each phase winding ($L_1$, $L_2$) is connected to a common node (8) of the circuit via a respective decoupling diode ($D_1$, $D_2$), and wherein parallel to the phase windings ($L_1$, $L_2$) and the corresponding decoupling diodes ($D_1$, $D_2$) a protective transistor circuit (10) is arranged that is driven in such a manner that the inductively induced voltage peaks are eliminated.

4 Claims, 1 Drawing Sheet

DRIVE-CIRCUIT OF A BRUSHLESS DC MOTOR

The present invention concerns a drive circuit for a brushless, electronically commutated DC motor wherein an electronic switching element is arranged in series with each phase winding of the motor and the switching element is driven in response to a sensor for the rotational position of the rotor, in particular formed as a digitally switched Hall IC, wherein each phase winding is connected to a common node of the circuit.

Such drive circuits have been known for a long time. Merely as an example, let us note the book, "Elektrische Kleinstmotoren und ihr Einsatz" [*Electrical fractional-horsepower motors and their use*] by Helmut Moczala, i. a., expert verlag/VDE-Verlag 1979, and therein above all pages 174 and 183. The decoupling diodes serve to discharge rotation-induced voltage from the currentless phase windings, which, for rotational control, can be fed to a regulator (rotational speed actual value signal) as a control signal solely dependent on rotational speed (tachometer voltage). As sensors for the rotational position of the rotor, digitally-switched Hall ICs are preferably used today and only less often analog Hall generators. Due to digital switching process, at the moment of cut off in the respective phase winding, very high voltage peaks $U=-L\,(di/dt)$, which are disadvantageous from many points of view always occur via self-induction (mutual inductance). Above all, they lead to a high power loss in the electronic switching elements so that these must be made correspondingly larger or more powerful than would be required for the given motor rating. This leads disadvantageously to higher component costs.

In principle, it would be possible to provide a larger smoothing capacitor for the control voltage; however, the regulating dynamics would be adversely affected. Another prior practice, damping of the switching elements by so-called Miller capacitors, connected from collector to base, leads to a reduced degree of effectiveness since the switching delay in the rotation of the motor causes biasing currents.

The objective of the present invention to improve a generic drive circuit for the solution of the problems described so that a good degree of effectiveness and, in case a regulator is provided, good regulation dynamics are guaranteed with the use of simple and cost-effective components.

According to the invention, this is achieved by arranging, parallel to the phase winding and the corresponding decoupling diodes, a protective transistor circuit that is connected in such a manner and is driven via the common node of the circuit in such a manner that inductively induced voltage peaks are eliminated (short-circuited). According to the invention, the voltage peak is thus, on the occurrence of a steep rise in voltage $+U=-L\,(di/dt)$ in the signal derived from the respective phase winding via the decoupling diode, short-circuited or limited via the protective transistor circuit to the actual value of the electromotive force induced in each currentless phase winding. Concretely, this is preferably achieved by a protective transistor being switched with its collector-emitter path parallel to the phase windings and the corresponding decoupling diodes, whereby its base is connected via a grading capacitor to a common node of the circuit. The grading capacitor can advantageously have a small capacitance so that we are dealing with a cost-effective component, in particular in relation to any very much larger smoothing capacitor that might otherwise be required. Due the gain of the protective transistor, virtually a very much greater capacitance, in fact greater by the gain, is in effect, but, advantageously, without storing the corresponding amount of energy. This has a very favorable effect on the regulation dynamics. If, for example, the protective transistor has a gain of about 400, the effective capacitance of the grading capacitor is increased by a factor or 400.

The invention is suitable above all for a drive circuit with regulator whereby the signal obtained via the decoupling diodes (electromotive force) is fed to a regulator as a tachometer voltage dependent on rotational speed. The invention is however also very advantageous without a regulator because, by eliminating the damaging voltage peaks, comparatively simple and cost-effective low-power transistors can be used as commutating switching elements. Since the invented protective transistor circuit limits the collector-emitter voltage $U_{C-E}$ of the commutation transistors optimally to $U_S$ and $U_S=U_{C-E}$, Miller capacitors or the like for lengthening the switching edges are advantageously not required so that the power loss of the commutation transistor is reduced and the degree of efficiency of the motor improved.

Further advantageous development characteristics of the invention are contained in the following description.

The invention is to be explained in more detail with the aid of two preferred embodiment examples illustrated in the drawings. Shown are:

FIG. 1 a drive circuit of the invention with regulator and

Figure 2:
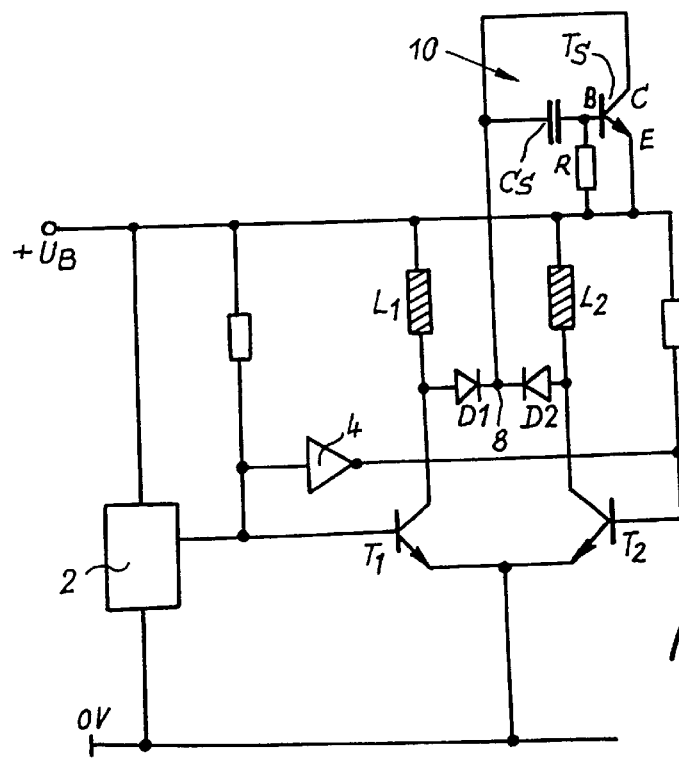

FIG. 2 a drive circuit of the invention without regulator

The embodiment example relates to a brushless DC motor with two phase windings $L_1$ and $L_2$. The invention is however not restricted to a two-phase motor. An electronic switching element $T_1$, $T_2$ is arranged in series with each phase winding $L_1$, $L_2$. For commutation of the phase windings, the switching elements $T_1$, $T_2$ are driven in response to the output signals of a sensor 2 for the rotational position of the rotor. This sensor 2 for the rotational position of the rotor is preferably formed as a digitally switched Hall IC. The sensor 2 for the rotational position of the rotor controls the switching elements $T_1$, $T_2$ directly or via an inverter 4 (transistor plus resistor). The phase windings $L_1$, $L_2$ can thus alternatively be switched for commutation wherein motor current then flows due to the operating voltage $U_B$.

In the embodiment example according to FIG. 1, a (rotational speed) regulator is provided to which the mutual electromotive force induced in the respective currentless phase winding is fed as a signal E dependent on rotational speed. This signal is discharged from the phase windings $L_1$ and $L_2$ via decoupling diodes $D_1$, $D_2$ and fed to the regulator 6 via a common point 8 in the circuit. The regulator 6 is connected to a control transistor $T_R$, which, in the embodiment example shown in FIG. 1, is preferably arranged as an in-phase regulator with its collector-emitter path in series with the switching elements $T_1$, $T_2$.

According to the invention a protective transistor circuit 10 is provided that is connected in parallel to the phase windings $L_1$, $L_2$ and to the corresponding decoupling diodes $D_1$, $D_2$. The protective transistor circuit 10 has a protective transistor $T_S$ that is connected with its collector-emitter path C-E in parallel to the phase winding and the corresponding decoupling diodes. The base B of the protective transistor $T_S$ is connected via a grading capacitor $C_S$ to the common node 8 of the circuit between the decoupling diodes. In addition, a resistor R is connected in parallel to the base-emitter path B-E of the protective transistor $T_S$. According to the invention, it is provided that the grading capacitor $C_S$ and/or the protective transistor $T_S$ are/is chosen in such a manner that the inductive voltage peaks $U=-L\,(di/dt)$ that are always induced by mutual inductance at the moment of shut off, are eliminated, that is, short-circuited, via the protective transistor $T_S$. Thus, the remaining voltage is limited to the induced emf at any given time.

As follows further from FIG. 1, a smoothing capacitor $C_G$ can be arranged parallel to the collector-emitter section C-E of the protective transistor $T_S$. With the aid of the protective transistor circuit 10 of the invention, this smoothing capacitor $C_G$ can have a comparatively low capacitance or even be entirely unnecessary.

The drive circuit without regulator is illustrated in FIG. 2. The signal picked up via the common node 8 of the circuit is consequently not needed as a tachometer voltage, but rather it serves exclusively in connection with the invented protective transistor circuit 10 to eliminate the damaging voltage peaks. The protective transistor circuit 10 corresponds to the embodiment according to FIG. 1.

A specific application example will be explained below. For a motor, for example for a manual mixing device, provided with a 24 V operating voltage $U_B$ and ca. 150 mA current consumption, the grading capacitor $C_S$ preferably has a capacitance of about 100 nF and the resistor R is about 12 kΩ. As protective transistor $T_S$, a very cost-effective small-signal transistor can be used, for example, a BC 847. This transistor is hardly thermally stressed because most of the time it is cut off and is only conducting for the short time of the phase winding shutoff peak.

If, according to FIG. 1, a smoothing capacitor $C_G$ is provided, then is also preferably has a capacitance of about 100 nF. It should be noted here that without the measure of the invention, a smoothing capacitor with a very much higher capacitance, lying in the μF range (for example, 2.2 μF) would be required.

The invention is not restricted to the embodiment example shown and described, but rather also includes all embodiments working equivalently in the sense of the invention. Furthermore, the invention is also still not as yet restricted to the combinations of characteristics defined in claim 1, but rather can also be defined by any other arbitrary combination of definite characteristics of all individual characteristics disclosed altogether. This means that in principle practically each individual characteristic of claim 1 can be left out or replaced by at least one individual characteristic disclosed at another place in the application. To this extent, claim 1 is to be understood merely as an initial attempt at formulation for the invention.

I claim:

1. Drive circuit for a brushless, electronically commutated DC motor, whereby an electronic switching element (T1,T2) is arranged in series with each phase winding (L1,L2) of the motor and the switching elements (T1,T2) are driven in response to a sensor (2) for the rotational position of the rotor, whereby each phase winding (L1,L2) via one decoupling diode each (D1,D2) is connected to a common node (8) of the circuit, characterized by the fact that parallel to the phase winding (L1,L2) and the corresponding decoupling diodes (D1,D2), a protective transistor circuit (10) is arranged that is driven in such a manner that the inductive voltage peaks are eliminated, and that the protective transistor circuit (10) has a protective transistor (TS) that is switched with its collector-emitter path (C-E) parallel to the phase windings (L1,L2) and to the corresponding decoupling diodes (D1,D2), and whose base (B) is connected via a grading capacitor (CS) to the common node (8) of the circuit.

2. Drive circuit according to claim 1, characterized by the fact that a resistor R is connected in parallel to the base-emitter path (B-E) of the protective transistor ($T_S$).

3. Drive circuit for a brushless, electronically commutated DC motor, whereby an electronic switching element (T1,T2) is arranged in series with each phase winding (L1,L2) of the motor and the switching elements (T1,T2) are driven in response to a sensor (2) for the rotational position of the rotor, whereby each phase winding (L1,L2) via one decoupling diode each (D1,D2) is connected to a common node (8) of the circuit, characterized by the fact that parallel to the phase winding (L1,L2) and the corresponding decoupling diodes (D1,D2), a protective transistor circuit (10) is arranged that is driven in such a manner that the inductive voltage peaks are eliminated, that the common node (8) of the circuit is connected to a control voltage input (+E) of a regulator (6), and that the regulator (6) has a control-output stage transistor (TR) that is connected in series with the switching elements ($T_1$, $T_2$) as an in-phase regulator.

4. Drive circuit according to claim 3, characterized by the fact that a smoothing capacitor CG is arranged in parallel to the collector-emitter path (C-E) of the protective transistor ($T_S$).

* * * * *